(12) United States Patent
Mistely

(10) Patent No.: US 7,313,745 B1
(45) Date of Patent: Dec. 25, 2007

(54) DECODER FOR PIN-BASED SCAN TEST

(75) Inventor: Roger C. Mistely, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 181 days.

(21) Appl. No.: 11/219,065

(22) Filed: Sep. 1, 2005

(51) Int. Cl.
*G01R 31/28* (2006.01)

(52) U.S. Cl. .................................. 714/727
(58) Field of Classification Search ........ 714/727
See application file for complete search history.

(56) References Cited

U.S. PATENT DOCUMENTS 6,418,545 B1 * 7/2002 Adusumilli ............ 714/729
6,560,739 B1 * 5/2003 Chung .................. 714/726

* cited by examiner

*Primary Examiner*—James C. Kerveros
(74) *Attorney, Agent, or Firm*—Martine Penilla & Gencarella, LLP

(57) ABSTRACT

An integrated circuit design block includes combinational and sequential logic defining core logic of the integrated circuit design block, and boundary logic defined at an outer region of the integrated circuit design block. The integrated circuit design block also includes a control test unit that has a scan chain decoder and a boundary scan decoder. The scan chain decoder includes scan chain select circuitry for enabling the scan chain decoder during scan testing of the core logic. The scan chain select circuitry further includes a pin for disabling the scan chain decoder during testing of the boundary logic. The scan chain decoder is limited to share pins defined by the boundary scan decoder, and is both 4-pin and 5-pin IEEE 1149.1 compliant.

16 Claims, 5 Drawing Sheets

DECODER FOR PIN-BASED SCAN TEST

BACKGROUND OF THE INVENTION

1. Field of the Invention

The present invention relates generally to integrated circuit design and testing, and more specifically to pin-based access for full-scan production testing of an integrated circuit device.

2. Description of the Related Art

In the testing of integrated circuits and circuit devices, an access mechanism is desired to configure the device for full-scan production test. Typically, a pin-based access is generally utilized for testing, but as circuitry becomes more complex, functional modes require use and control of most available existing device pins. What is desired is a pin-based access without increasing the pin count which would fundamentally alter the cell type.

In one prior art approach, scan test access is available by shifting in pre-defined instructions. However, the shifting in of instructions is generally undesirable as a method of configuring the device for production test since it involves the use of sequential elements before they have been screened for manufacturing defects. Further, application of such instructions can be cumbersome and can complicate efforts to debug the setup in the event that the initialization sequence malfunctions.

In order to maintain the cell architecture and configuration while programming the device for manufacturing test, only unregistered pin inputs are potential candidates for the desired access. This restriction essentially eliminates all functional input/output (I/O) pins since these are associated with boundary scan cells implemented as part of the internal scan chain. Further, any modification to an I/O pin or entire cell would create a new cell type, which is to be avoided. Moreover, such a modification would add unnecessary loading to the functional path, with a corresponding degradation in performance.

In light of the foregoing, a method of access and circuit design is desired to enable full-scan production testing of increasing complex circuitry without increasing pin count or effecting application pathways or artwork.

SUMMARY OF THE INVENTION

Broadly speaking, the present invention fills these needs by providing a simple combinational configuration mechanism for entering manufacturing test which avoids degrading application performance by functionally overloading pre-existing, non-critical test ports. It should be appreciated that the present invention can be implemented in numerous ways, including as a process, an apparatus, a system, a device, or a method. Several inventive embodiments of the present invention are described below.

In one embodiment, an integrated circuit (IC) design block is provided. The IC design block includes combinational and sequential logic defining core logic of the IC design block, and boundary logic defined at an outer region of the IC design block. The IC design block further includes a clock and test control unit having a scan chain decoder and a boundary scan decoder. The scan chain decoder includes a scan chain select circuitry for enabling the scan chain decoder during scan testing of the core logic. The scan chain select circuitry further includes a pin for disabling the scan chain decoder during testing of the boundary logic. The scan chain decoder is limited to share pins defined by the boundary scan decoder.

In another embodiment, a pin-based method of enabling full-scan production test functionality of a multi-core chip is provided. In a scan test decoder of a clock and test control unit having a JTAG controller, the method includes asserting TEST_MODE signal high, and receiving the TEST_MODE signal in a first AND logic gate. The method further includes inverting a TRST_L signal, and receiving the inverted TRST_L signal in the first AND logic gate. In a second AND logic gate, a TMS signal is received, and so is an output of the first AND logic gate. The second AND logic gate outputs a Global Shift Enable.

In a further embodiment, a circuit enabled method of achieving full-scan production functionality in a multi-core computer chip is provided. The method includes capturing a TMS signal to a JTAG controller in a clock and test control unit, capturing a TRST_L signal to the JTAG controller in the clock and test control unit, and capturing a TEST_MODE signal existing in the clock and test control unit. When scan enable is desired, the method provides for asserting the TEST_MODE signal active and setting the TRST_L signal active. The TEST_MODE signal is input into a first AND logic gate, and an inverted TRST_L signal is input into the first AND logic gate. The method then provides for outputting a signal from the first AND logic gate into a second AND logic gate, and inputting the TMS signal into the second AND logic gate.

The advantages of the present invention over the prior art will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION

An invention for a circuit design block providing pin-based access to full-scan production testing while maintaining full compliance with 5-pin IEEE 1149.1 at the system level, and full compliance with 4-pin IEEE 1149.1 for applicable production modes is described. In exemplary embodiments, pin-based access is obtained through the Test Access Port or TAP, while maintaining the desired IEEE compliance.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
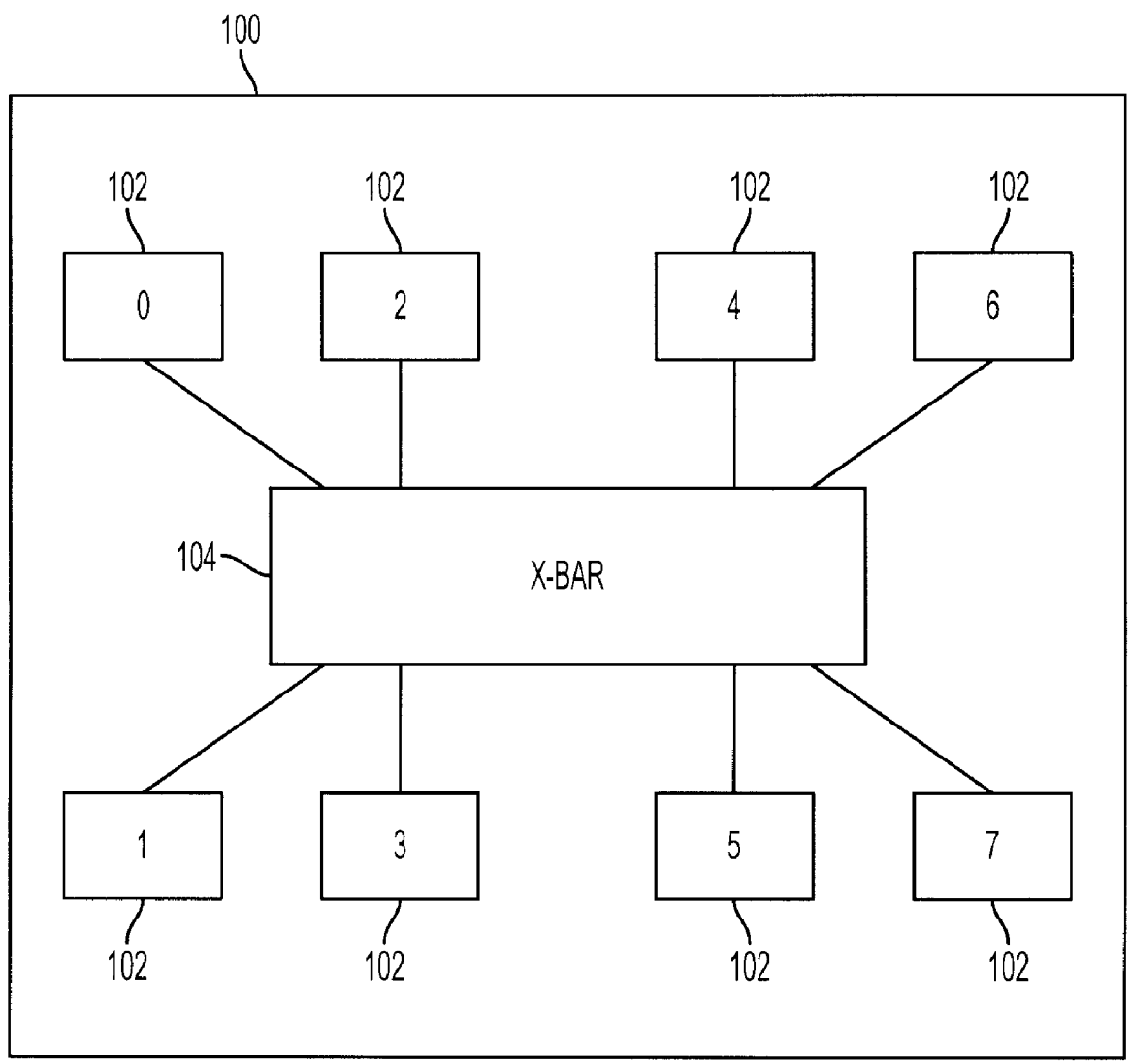
FIG. 1 is a schematic illustration of an exemplary multi-core chip in accordance with one embodiment of the present invention.

Embodiments of the present invention provide for pin-based access for full-scan production testing of increasingly complex circuitry. Devices such as multi-core structures, i.e., multi-core chips can contain densely populated logic with a plurality of multi-function pins around a periphery of the chip. FIG. 1 is a schematic illustration of an exemplary multi-core chip 100 in accordance with one embodiment of the present invention. A multi-core chip has been selected for illustration as an exemplary device, but it should be appreciated that embodiments of the present invention are equally applicable to single-core, and generally all types of complex computing devices and structures. In FIG. 1, multi-core chip 100 is shown typically illustrated as having four cores 102 in an upper region of the multi-core chip 100, and four cores 102 in a lower region of the multi-core chip, with a connecting cross-bar 104 interconnecting the individual cores 102. It should be appreciated that FIG. 1 is a schematic illustration that is not drawn to scale, and the logic of an actual chip is dispersed throughout the structure.

In multi-core chip 100, up to 32 scan chains might be implemented in the sequential elements, requiring up to 64 ports with up to 32 ports required for scan-in functionality, and up to 32 ports required for scan-out functionality. A typical configuration might include two scan chains, each containing 12-thousand scan cells in each of the cores 102, and two scan chains, each containing 17-thousand scan cells in cross-bar 104. It should therefore be appreciated that the multiple pins required for functionality leaves essentially few pins, if any, available for production scan test access.

Figure 2:
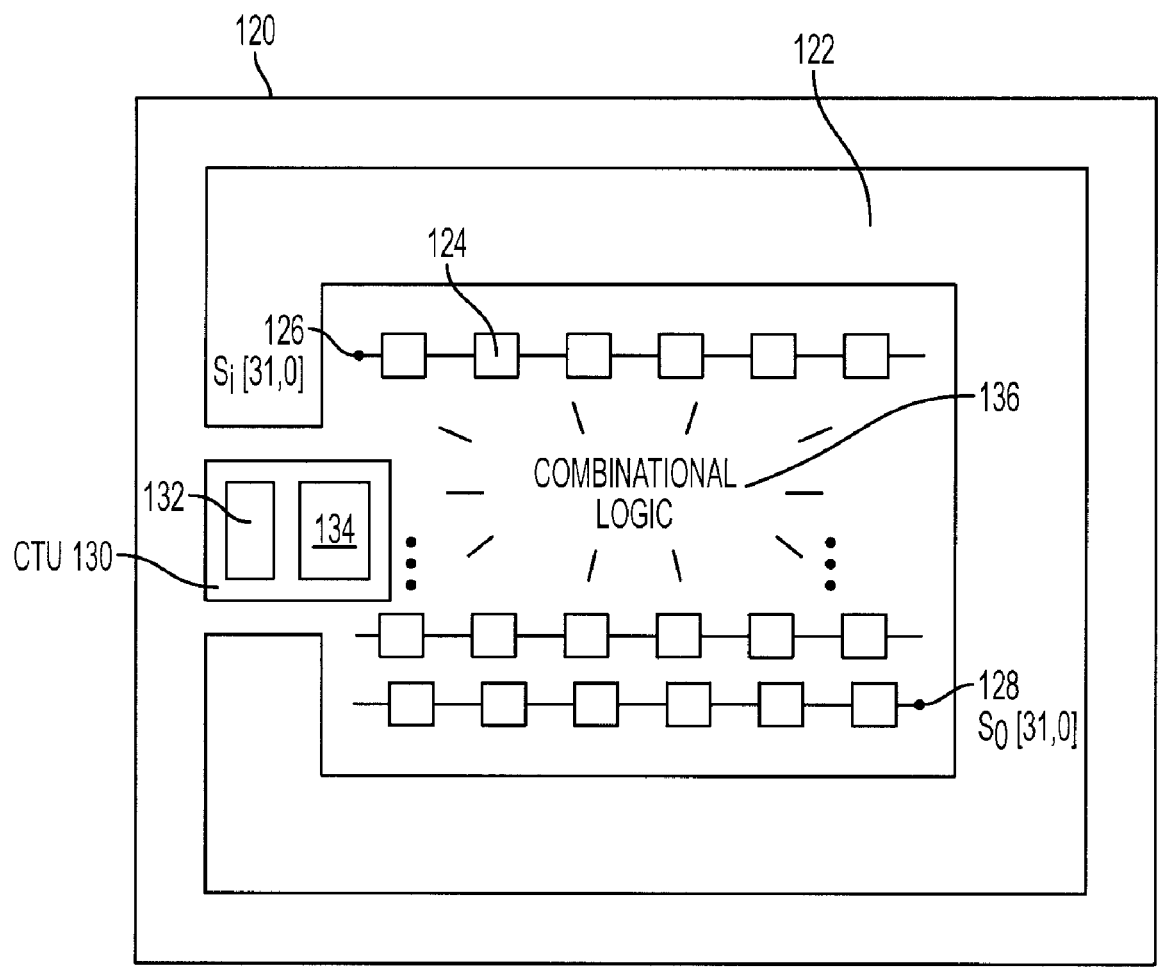
FIG. 2 is a functional schematic illustration of an exemplary multi-core chip in accordance with an embodiment of the present invention.

FIG. 2 is a functional schematic illustration of an exemplary multi-core chip 120 in accordance with an embodiment of the present invention. As shown in FIG. 2, multi-core chip 120 includes boundary scan logic 122, and a plurality of representative chains of scan chain logic 124. Combinational logic 136 is generally represented disbursed throughout multi-core chip 120 in FIG. 2. As described above in reference to FIG. 1, each multi-core chip 120 might include up to 32 sequential logic scan chains, requiring up to 32 scan-in ports 126, and a corresponding up to 32 scan-out ports 128. Multi-functional pins, also referred to as multiplexed pins or muxed pins, provide access to the scan-in 126 and the scan-out 128 ports, and are generally arranged around the periphery of multi-core chip 120.

In addition to the sequential and combinational logic, and the multi-functional pins of multi-core chip 120, a clock and test control unit (CTU) 130 is provided to enable board testing and other internal function testing during production. In one embodiment of the present invention, the CTU 130 incorporates the Joint Test Action Group (JTAG) test access port (TAP) controller 134, hereinafter referred to as JTAG controller 134, and an inventive scan test decoder 132.

As is generally known, JTAG controller 134 typically enables access and functionality for JTAG/IEEE 1149.1 boundary scan testing of printed circuitry boards, devices, systems, and the like. Through the limited 4-pin or, optionally, 5-pin interface, it is possible to load serial instructions classified as "mandatory," "optional," and "user-defined," for system-based test and debug. The interface controls a state machine which is implemented for the application of these instructions and any associated data.

In an embodiment of the present invention, an access mechanism is provided to configure a device or structure such as a multi-core chip, i.e., multi-core chip 120, for full-scan production testing without increasing existing pin count. In order to maintain a given configuration while scanning multi-core chip 120, unregistered inputs need to be identified for use. All functional I/O pins are essentially associated with boundary scan cells, and are essentially fabricated as part of the internal scan chain. Any modification to an I/O cell, such as designing and adding more pins and space to accommodate additional pins, would create a new cell type. Embodiments of the present invention utilize existing pins to enable access. The utilized pins are those of the industry standard IEEE 1149.1 JTAG controller 134.

As is generally known, the IEEE 1149.1 standard evolved to address board testing issues at the system level. Further, it is generally known that there is a limited pin interface which has proved popular for activating various user-defined functions. Accessing these user-defined functions, however, typically requires manipulation of a state machine and application of shift sequences as defined by the standard. The state machine manipulation and shift functions operate at the system level. However, initialization and setup is unnecessarily burdensome for the purpose of screening for manufacturing defects on untested structures in production. Embodiments of the present invention maintain the functionality of the TAP port where necessary, but further enable existing pins of the JTAG controller 134 to be used for combinational decoding of the scan test configuration, including structural testing of the JTAG controller 134 itself.

Figure 3:
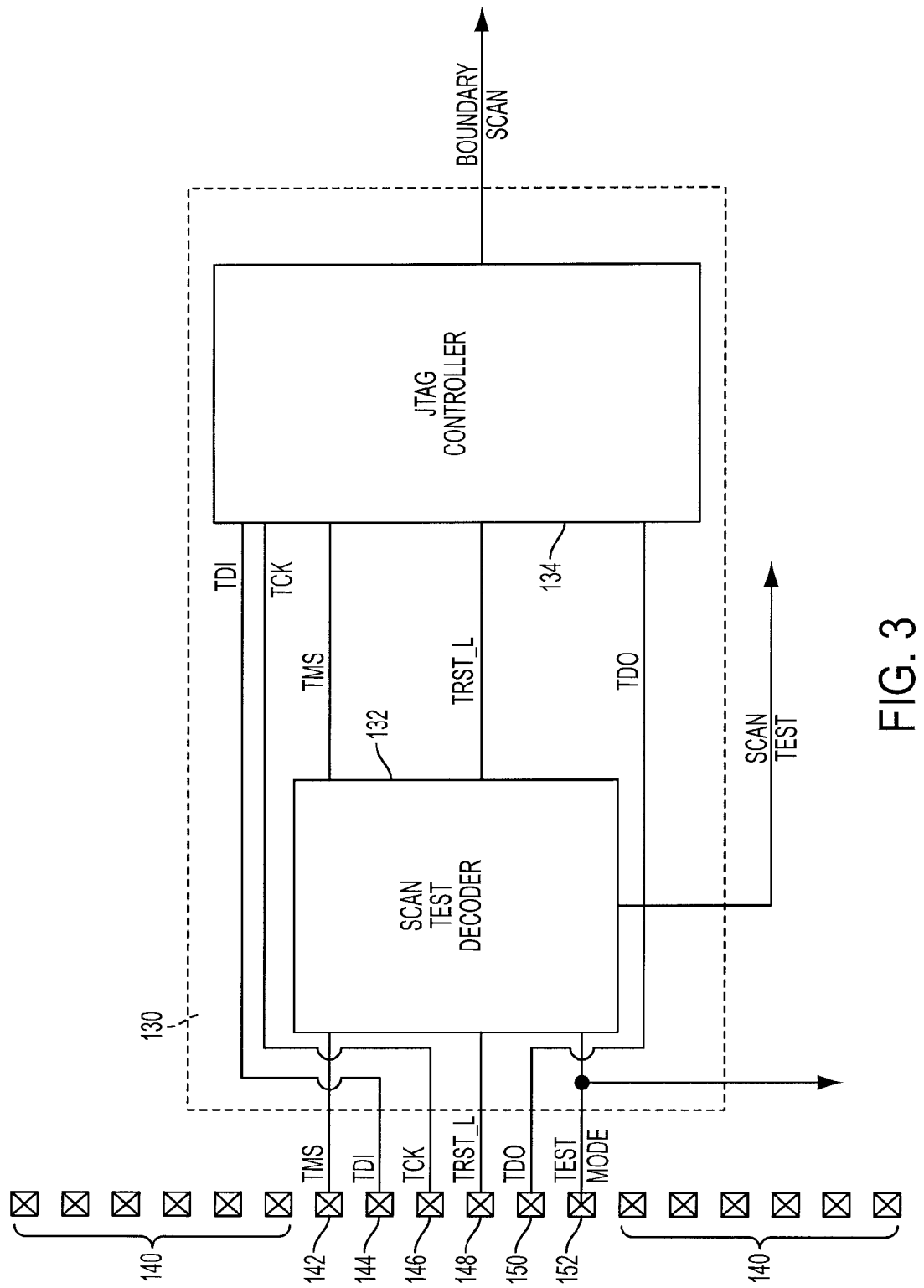
FIG. 3 shows a detail view of CTU in accordance with an embodiment of the present invention.

FIG. 3 shows a detail view of CTU 130 in accordance with an embodiment of the present invention. In FIG. 3, representative functional pins 140 are shown to illustrate the density of structure architecture. In one embodiment of the invention, CTU 130 includes scan test decoder 132 and JTAG controller 134. The pins, also referred to as the signals, associated with JTAG controller 134 include TMS 142, which is the mode select signal, TDI 144, the input signal, TCK 146, the clock signal, TRST_L 148, the reset signal, and TDO 150, the output signal. A pre-existing pin, TEST_MODE 152, whose function is to configure internal test modes, is added to the scan test decoder 132 in one embodiment of the invention. In one embodiment of the invention, each of the signals and pins remains available and functional in order to comply with IEEE 1149.1.

In one embodiment of the present invention, scan test decoder 132 captures and utilizes two pins of JTAG controller 134 together with a dedicated TEST_MODE pin 152 to enable scan testing. When JTAG controller 134 is desired for IEEE 1149.1 boundary scan testing, the captured signals are passed through scan test decoder 132 and normal functioning is maintained. In one embodiment of the invention, when scan testing is desired, scan test decoder 132 utilizes the captured signals to enable global shift, thereby activating scan test functionality.

In one embodiment of the present invention, TMS 142, TRST_L 148, and TEST_MODE 152 are captured by scan test decoder 132 to effect a global shift enable and scan test functionality. TEST_MODE 152 is used to disable the scan function in a system environment. TEST_MODE 152 is tied inactive when the device is configured in the system, but TEST_MODE 152 continues to allow access to internal test functions for production. In one embodiment of the present invention, TEST_MODE 152 is maintained active to enable scan test decoder functionality.

It should be appreciated that the desired functionality of scan test decoder 132 can be achieved through any of a plurality of logic structures and combinations using the selected TMS 142, TRST_L 148, and TEST_MODE 152 pins. In an embodiment of the present invention, with TEST_MODE 152 active, decoding is achieved by abandoning an optional asynchronous reset function and using TRST_L 148 to select between 4-pin IEEE 1149.1 compliance (TEST_MODE 152, TRST_L 148)=(1,1), and scan mode (TEST_MODE 152, TRST_L 148)=(1,0). In the latter case, i.e., scan mode, the JTAG 134 no longer performs as a functioning structure, allowing TMS 142 to be used as the scan enable pin for the device. When TEST_MODE is not asserted (TEST_MODE, TRST_L)=(0, X), 5-pin IEEE 1149.1 compliance is in effect.

Figure 4:
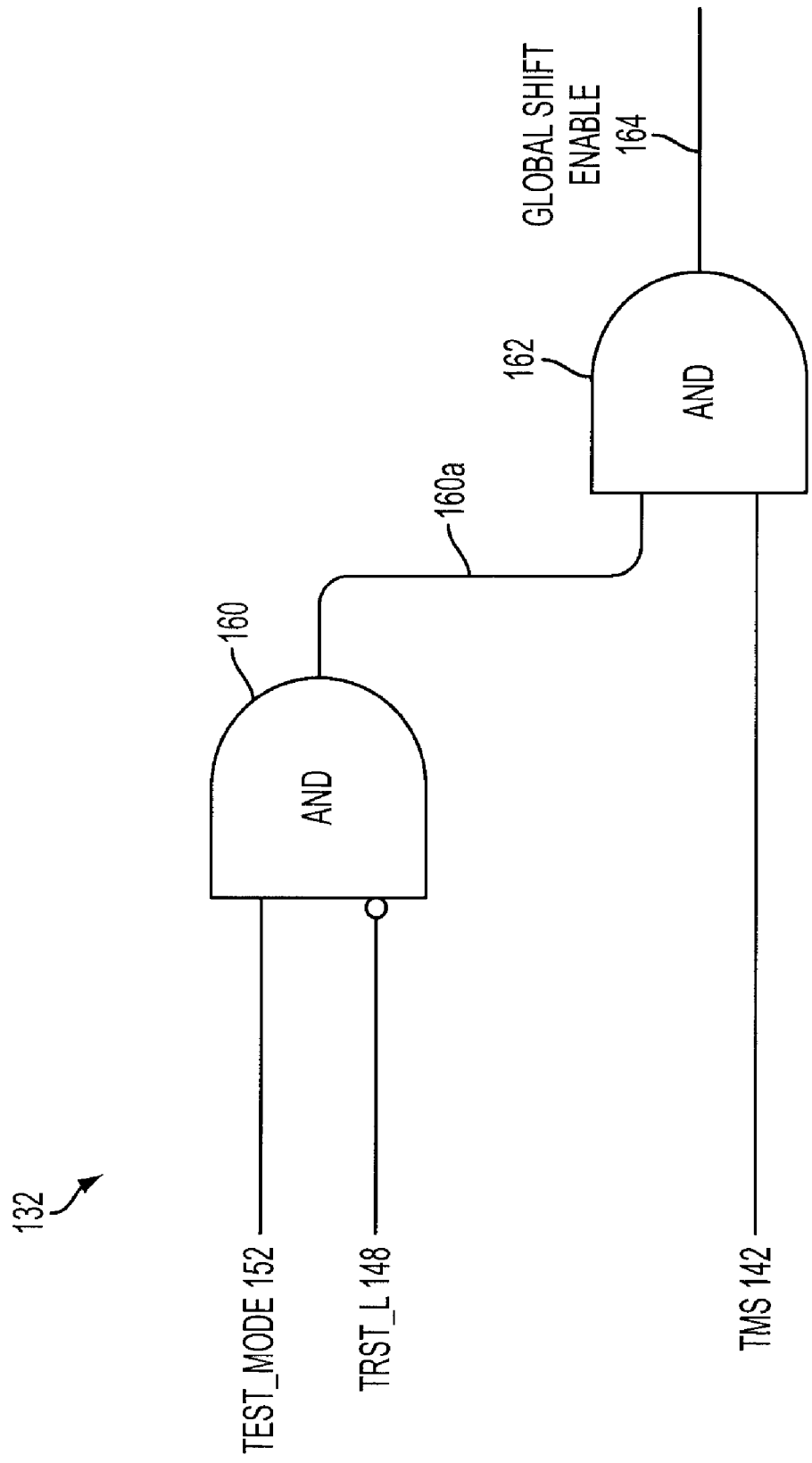
FIG. 4 is an exemplary schematic of a scan test decoder in accordance with one embodiment of the present invention.

As described above, a plurality of logic combinations can be structured to achieve the object of embodiments of the present invention, and actual implementation will be based on effected structure, design preferences, and the like. FIG. 4 is an exemplary schematic of a scan test decoder 132 in accordance with one embodiment of the present invention. The TEST_MODE 152 and an inverted TRST_L are received by AND logic 160. Output 160*a* and TMS 142 are received by AND gate 162, enabling a global shift enable output 164, and the desired access to scan configuration. As described above, when TEST_MODE is asserted, 4-pin IEEE 1149.1 compliance can be achieved. When TEST_MODE 152 is not asserted, 5-pin IEEE 1149.1 compliance can be achieved.

Figure 5:
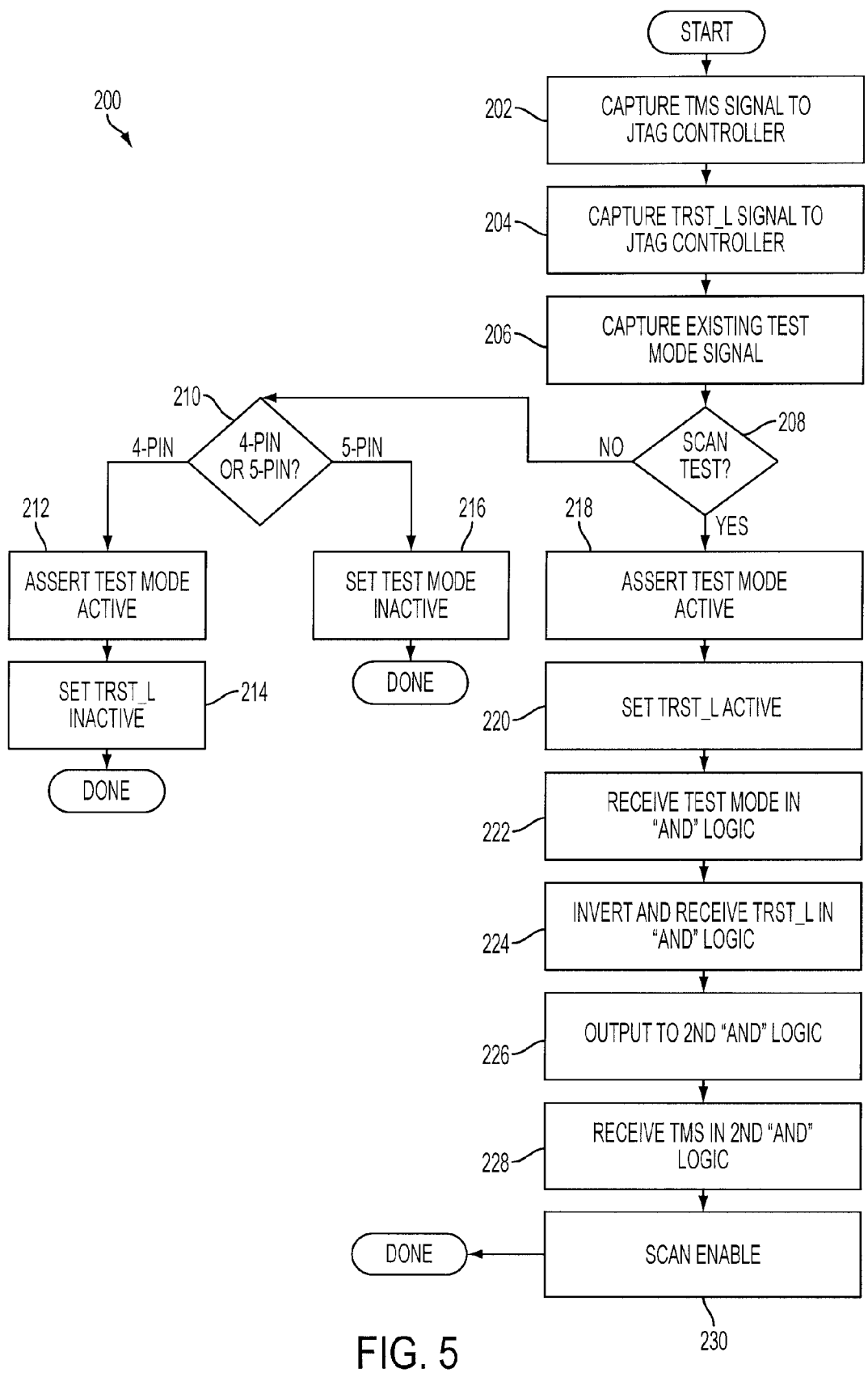
FIG. 5 is a flow chart diagram illustrating the method operations for enabling scan mode from signals within a CTU in accordance with one embodiment of the present invention.

FIG. 5 is a flow chart diagram 200 illustrating the method operations for enabling scan mode from signals within a CTU in accordance with one embodiment of the present invention. A pre-existing TEST_MODE signal, and signals dedicated to a JTAG controller are utilized, without increasing pin count or effecting application pathways or artwork.

The method begins with method operations 202, 204, and 206 in which the TMS signal and the TRST_L signal flowing to the JTAG controller (operations 202 and 204), and the pre-existing TEST_MODE signal are captured in the CTU. In one embodiment, the sequence of operations 202, 204, and 206 is essentially simultaneous or interchangeable.

The method continues with decision block 208 in which it is determined whether scan enable is desired. In one embodiment, the pins for the JTAG controller (TMS and TRST_L) and the TEST_MODE signal are in or associated with the CTU. By capturing and manipulating the signals in accordance with embodiments of the present invention, full scan production testing is enabled, as well as maintaining full compliance with either 5-pin or 4-pin IEEE 1149.1. In decision block 208, it is determined whether scan enable is desired or not which would enable the desire IEEE compliance.

If, in decision block 208, scan enable is not desired, a "no" to decision block 208, the method continues to decision block 210 where it is determined whether 4-pin or 5-pin compliance is desired. If 4-pin compliance is desired, the method proceeds to method operation 212 in which TEST_MODE is asserted active, and to method operation 214 in which TRST_L is set inactive. At this point, 4-pin compliance is achieved, and the method is done. If, at decision block 210, 5-pin compliance is desired, the method proceeds to method operation 216 in which TEST_MODE is set inactive. With TEST_MODE inactive, 5-pin compliance is maintained, and the method is done.

In one embodiment of the invention, scan enable is desired, and at decision block 208 a "yes" results in the method proceeding to method operation 218 in which TEST_MODE is asserted active. The method proceeds to method operation 220 in which TRST_L is set active.

In one embodiment of the present invention, an inventive scan test decoder is implemented as the method proceeds with operation 222 in which the active TEST_MODE signal is received in a first AND logic gate. In operation 224, the active TRST_L is inverted, and received in the first logic gate. The output of the active TEST_MODE signal and the inverted active TRST_L signal is sent to a second AND logic gate in operation 226.

In operation 228, the TMS signal and the output signal of operation 226 are received in the second AND logic gate. Scan enable results in operation 230, and the method is done.

As described above, the logic operations decoding the captured signals to achieve scan enable can be formed and combined in a multitude of simple and complex logic. The method illustrated in flowchart 200 is one example of a decoder in accordance with one embodiment of the invention, and should not be interpreted as limiting or exclusive.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Embodiments of the present invention can be processed on a single computer, or using multiple computers or computer components which are interconnected. A computer, as used herein, shall include a standalone computer system having its own processor, its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC) design block, comprising:
   a. combinational and sequential logic defining core logic of the IC design block;
   b. boundary logic defined at an outer region of the IC design block; and
   c. a clock and test control unit having a JTAG controller, a scan test decoder and a boundary scan decoder, the scan test decoder including scan chain select circuitry for enabling the scan test decoder during scan testing of the core logic, and the scan chain select circuitry further including a TEST MODE pin for disabling the scan chain decoder during testing of the boundary logic and bypassing the JTAG controller during the scan testing of the core logic,
   wherein the scan test decoder is limited to share pins defined by the boundary scan decoder.

2. The IC design block of claim 1, wherein the core logic of the IC design block defines a multi-core integrated circuit.

3. The IC design block of claim 1, wherein when the TEST_MODE pin is set inactive, the scan test decoder is disabled.

4. The IC design block of claim 1, wherein the IC design block is IEEE 1149.1 compliant for a four-pin configuration.

5. The IC design block of claim 1, wherein the IC design block is IEEE 1149.1 compliant for a five-pin configuration.

6. The IC design block of claim 1, wherein when the TEST_MODE pin is set inactive, the IC design block is IEEE 1149.1 compliant for a five-pin configuration.

7. The IC design block of claim 1, wherein the scan test decoder comprises:
   a first AND logic gate; and
   a second AND logic gate,
   wherein a TEST_MODE signal is received in the first AND logic gate, a TRST_L signal is inverted and received in the first AND logic gate, the output of the first AND logic gate is received in the second AND logic gate, and a TMS signal is received in the second AND logic gate, the output of the second AND logic gate enabling global shift.

8. A pin-based method of enabling full-scan production test functionality of a multi-core chip, comprising:
   in a scan test decoder of a clock and test control unit having a JTAG controller,
   asserting TEST_MODE signal high;
   receiving the TEST_MODE signal in a first AND logic gate;
   inverting a TRST_L signal;
   receiving the inverted TRST_L signal in the first AND logic gate
   receiving a TMS signal in a second AND logic gate;
   receiving an output of the first AND logic gate in the second AND logic gate; and
   outputting a Global Shift Enable.

9. The method of claim 8, wherein if the TEST_MODE is set inactive, IEEE 1149.1 5-pin compliance is achieved.

10. The method of claim 8, wherein when TEST_MODE is set active and TRST_L is set inactive, IEEE 1149.1 4-pin compliance is achieved.

11. The method of claim 8, further comprising:
    setting the TRST_L signal active.

12. The method of claim 11, wherein the clock and test control unit having a JTAG controller incorporates a state machine.

13. In a multi-core computer chip, a circuit enabled method of achieving full-scan production functionality, comprising
    capturing a TMS signal to a JTAG controller in a clock and test control unit;
    capturing a TRST_L signal to the JTAG controller in the clock and test control unit; and
    capturing a TEST_MODE signal existing in the clock and test control unit,
    wherein when scan enable is desired,
        asserting the TEST_MODE signal active;
        setting the TRST_L signal active;
        inputting the TEST_MODE signal into a first AND logic gate;
        inputting an inverted TRST_L signal into the first AND logic gate;
        outputting a signal from the first AND logic gate into a second AND logic gate; and
        inputting the TMS signal into the second AND logic gate.

14. The method of claim 13, wherein the multi-core computer chip is IEEE 1149.1 four-pin compliant.

15. The method of claim 13, wherein the multi-core computer chip is IEEE 1149.1 five-pin compliant.

16. The method of claim 13, wherein the clock and test control unit includes a state machine.

* * * * *